US009835672B1

(12) United States Patent
Andrews et al.

(10) Patent No.: US 9,835,672 B1
(45) Date of Patent: Dec. 5, 2017

(54) POWER LINE ASSESSMENT USING A VIRTUAL CIRCUIT

(71) Applicant: Elecsys International Corporation, Olathe, KS (US)

(72) Inventors: Matthew Andrews, Lenexa, KS (US); Robert Stamm, Olathe, KS (US)

(73) Assignee: Elecsys International Corporation, Olathe, KS (US)

( * ) Notice: Subject to any disclaimer, the term of this patent is extended or adjusted under 35 U.S.C. 154(b) by 0 days.

(21) Appl. No.: 15/370,621

(22) Filed: Dec. 6, 2016

(51) Int. Cl.
*G01R 31/02* (2006.01)
*H04B 3/46* (2015.01)
*G01R 31/08* (2006.01)

(52) U.S. Cl.
CPC ......... *G01R 31/083* (2013.01); *G01R 31/025* (2013.01)

(58) Field of Classification Search
CPC .... G01R 31/083; G01R 31/085; G01R 31/02; G01R 31/001; G01R 31/005; G01R 31/01; G01R 31/08; G01R 31/12; G01R 31/24; G01R 31/26; G01R 31/28; G01R 31/327; G01R 31/34; G01R 31/36; G01R 31/40; G01R 31/44; G01R 31/025
USPC .................. 324/541, 544, 551, 555
See application file for complete search history.

(56) References Cited

U.S. PATENT DOCUMENTS

| | | | | |
|---|---|---|---|---|
| 4,980,645 A | * | 12/1990 | Soma | G01R 27/18 324/541 |
| 5,276,401 A | * | 1/1994 | Soma | G01R 31/021 324/544 |
| 5,397,963 A | * | 3/1995 | Manson | H05B 37/038 315/119 |
| 6,717,660 B1 | * | 4/2004 | Bernardo | H05B 37/034 315/130 |
| 9,008,992 B2 | * | 4/2015 | Nabrotzky | G01R 31/086 702/122 |
| 2009/0222223 A1 | * | 9/2009 | Walters | G01R 31/44 702/58 |
| 2011/0007443 A1 | * | 1/2011 | Crookham | H02H 3/347 361/93.2 |
| 2012/0245880 A1 | * | 9/2012 | Nabrotzky | G01R 31/086 702/122 |

* cited by examiner

*Primary Examiner* — Patrick Assouad
*Assistant Examiner* — Sean Curtis
(74) *Attorney, Agent, or Firm* — Erise IP, P.A.

(57) ABSTRACT

A system and method are described for determining if power lines have been damaged. A virtual circuit is established between a control unit and a remote response unit. A signal is transmitted from the remote response unit responsive to a prior signal transmitted by the control unit. Based on a comparison of measurements of the response signal to expected values, a determination is made as to whether or not the line has been damaged.

24 Claims, 10 Drawing Sheets

POWER LINE ASSESSMENT USING A VIRTUAL CIRCUIT

BACKGROUND

1. Field

Embodiments of the invention are broadly directed to systems and methods of assessing power lines for possible damage. More specifically, embodiments of the invention send a signal through a virtual circuit established along a line configured to provide electric current to one or more lights, then receive and analyze a responsive signal to determine if the line is damaged and leaking current.

2. Related Art

Large environmental lighting systems, such as streetlights, are powered by current-carrying power lines buried along pathways from regularly spaced control boxes, known as pedestals. If these underground lines are damaged, even only partially, the rate at which current leaks into the earth will significantly increase, causing the lights to flicker, dim, or completely fail to operate.

Damage to the lines supplying power to lights commonly occurs when other lines, such as fiber optic cables, are being buried. Such cables are not typically buried by digging a long trench, but rather by digging a hole at each end of the desired path and drilling a path between the holes. The cable is then pushed down the drilled hole. This method requires the movement of much less earth, but can completely or partially damage power lines along the drilled path. The cables are typically laid during the daytime, when the lines supplying power to the lights are not electrified, negating any danger that the operator of the drill will be shocked. However, unelectrified lines also means that any damage to the line will be unknown until the next time the lines are electrified, typically later that night. By this time, the operator may no longer be present and/or able to fix the problem.

A simple method of assessing the integrity of a power line is to electrify the line to a voltage level sufficient to power the lights and then check to see if each light is functioning. However, this powering the lines during the day is expensive and inconvenient for the particular provider of utilities (e.g., the local city government or municipality). Additionally, powering the lines during the daytime may be dangerous for workers and bystanders. What is needed is an improved system and method for determining whether or not power lines have been damaged enough to impact the functioning of large, environmental lights without having to activate the lights.

SUMMARY

Embodiments of the invention provide systems and methods for assessing the condition of a line that is configured to supply electric current to one or more lights, such as streetlights. A first embodiment of the invention is directed to a method of assessing the line including the steps of transmitting from a control unit a test signal on the line that charges an energy storage device in a remote response unit connected at a distant point on the line. Once the energy storage device reaches a threshold level of charge, a response signal is sent back to the control unit. A delay in receiving this response signal, a decrease in its expected amplitude, or a failure to receive the response signal at all indicates that the line has been damaged.

A second embodiment of the invention is directed to a method of assessing the line including the steps of transmitting a signal on the line with a test frequency that is above a range of usable frequencies for lights attached to the line. Current supplied by the test signal charges an energy storage device until it reaches a threshold level of charge, at which point a response signal is transmitted at a response frequency that is also above a range of usable frequency for the lights. If the amplitude of the response signal is below an expected percentage of the amplitude of the test signal, an alert is generated indicating damage to the line.

A third embodiment of the invention is directed to a system configured to assess a condition of a line configured to supply electric current to a light including a control unit and a remote response unit. The control unit comprises a processor, first transmitter, first receiver, and first signal generator, and may further comprise a communications module. The remote response unit comprises an energy storage device, second transmitter, second receiver, and second signal generator. The energy storage device may be, for instance, a battery, an inductor, or a capacitor. The remote response unit is configured to perform the steps of receiving a test signal from the control unit, which charges its energy storage device. When the energy storage device reaches a threshold of charge, the remote response unit transmits a response signal to the control unit. The processor of the control unit is configured to generate a determination of damage to the line in response to an analysis of the response signal.

This summary is provided to introduce a selection of concepts in a simplified form that are further described below in the detailed description. This summary is not intended to identify key features or essential features of the claimed subject matter, nor is it intended to be used to limit the scope of the claimed subject matter. Each of the above embodiments may include further hardware, components, applications, or steps not explicitly described. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
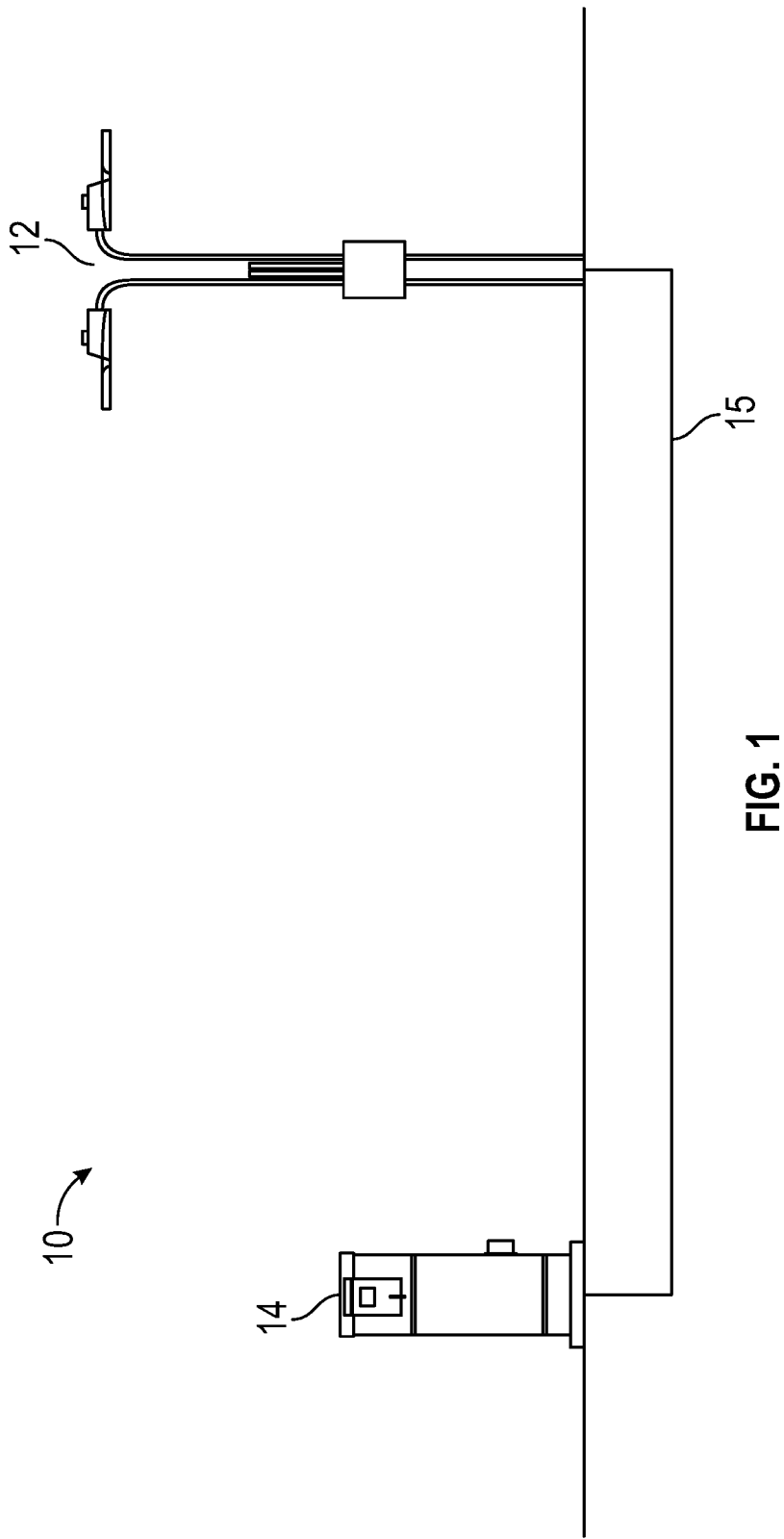
FIG. 1 is an illustration of a control unit coupled to a light via a line configured to carry current.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Embodiments of the invention provide systems and methods of assessing a condition of a line configured to supply electric current to a light to determine if the line has been damaged. Embodiments of the invention establish a virtual circuit that transmits a signal between two points on the line. Measuring parameters of the signal, embodiments of the invention use a comparison with expected values for these parameters to generate a determination of damage. Embodiments of the invention may generate an alert if the comparison indicates that the line is damaged.

Figure 2:
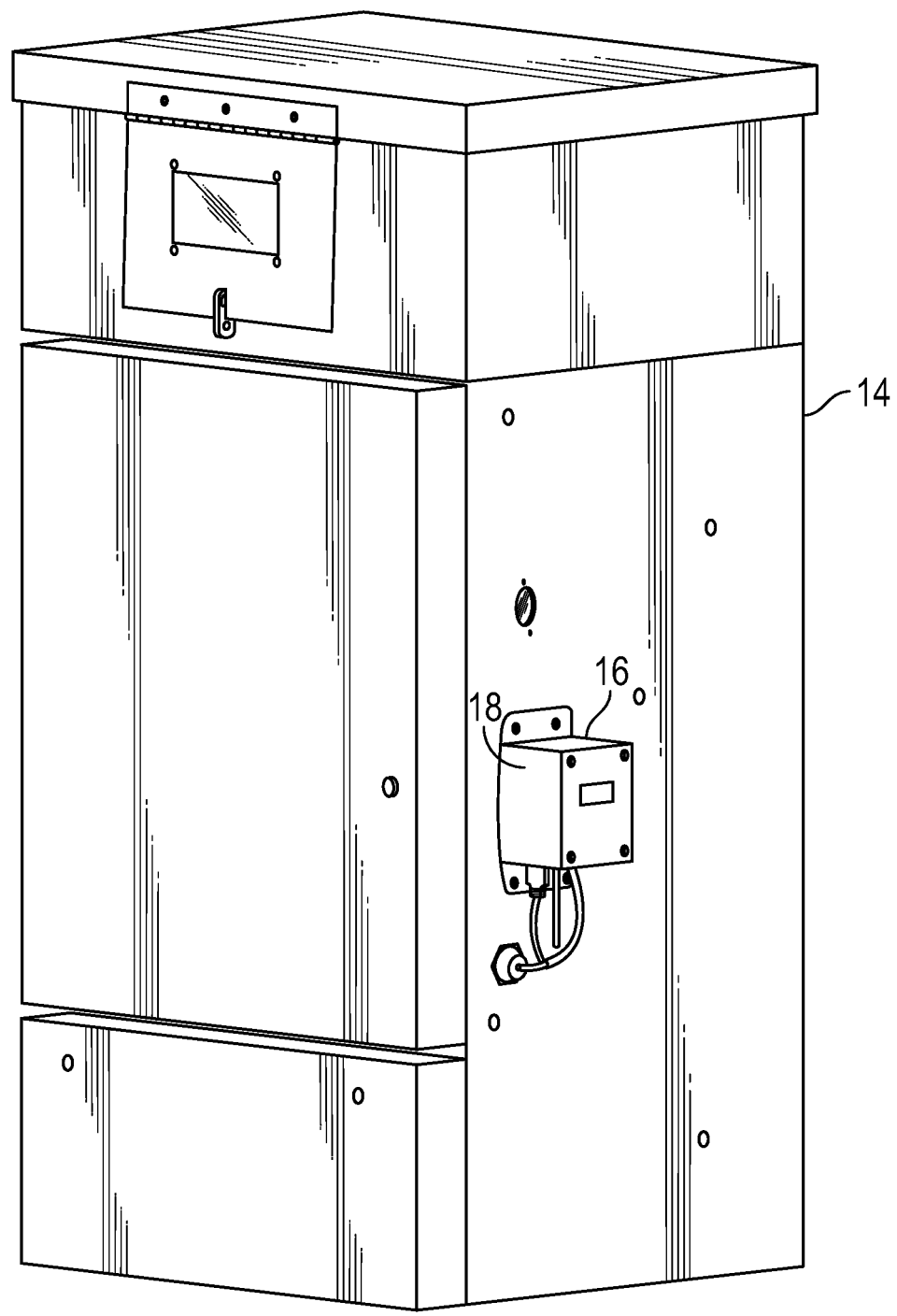
FIG. 2 depicts a pedestal control unit that may be utilized in embodiments of the invention.

Turning to the figures, and particularly FIG. 1, an exemplary lighting system 10 is illustrated, with a light 12 controlled by a pedestal 14. For simplicity, only a single light is shown, but in many cases a plurality of lights will be connected to a single line 15, controlled by a pedestal 14. The pedestal 14, as shown in more detail in FIG. 2, houses a control unit 16. The control unit 16 may be incorporated into a single housing 18 or may be spread throughout the internal components and/or structure of pedestal 14. In embodiments where the control unit 16 is incorporated into a single housing 18, the housing 18 may be structurally and electrically coupled to the pedestal 14, and may or may not be removable. Specifically, the control unit 16 may be permanently affixed to pedestal 14 or may be attached as desired to perform an assessment of damage to line 15. The control unit 16 may, in some embodiments, then be detached from pedestal 14.

Figure 3:
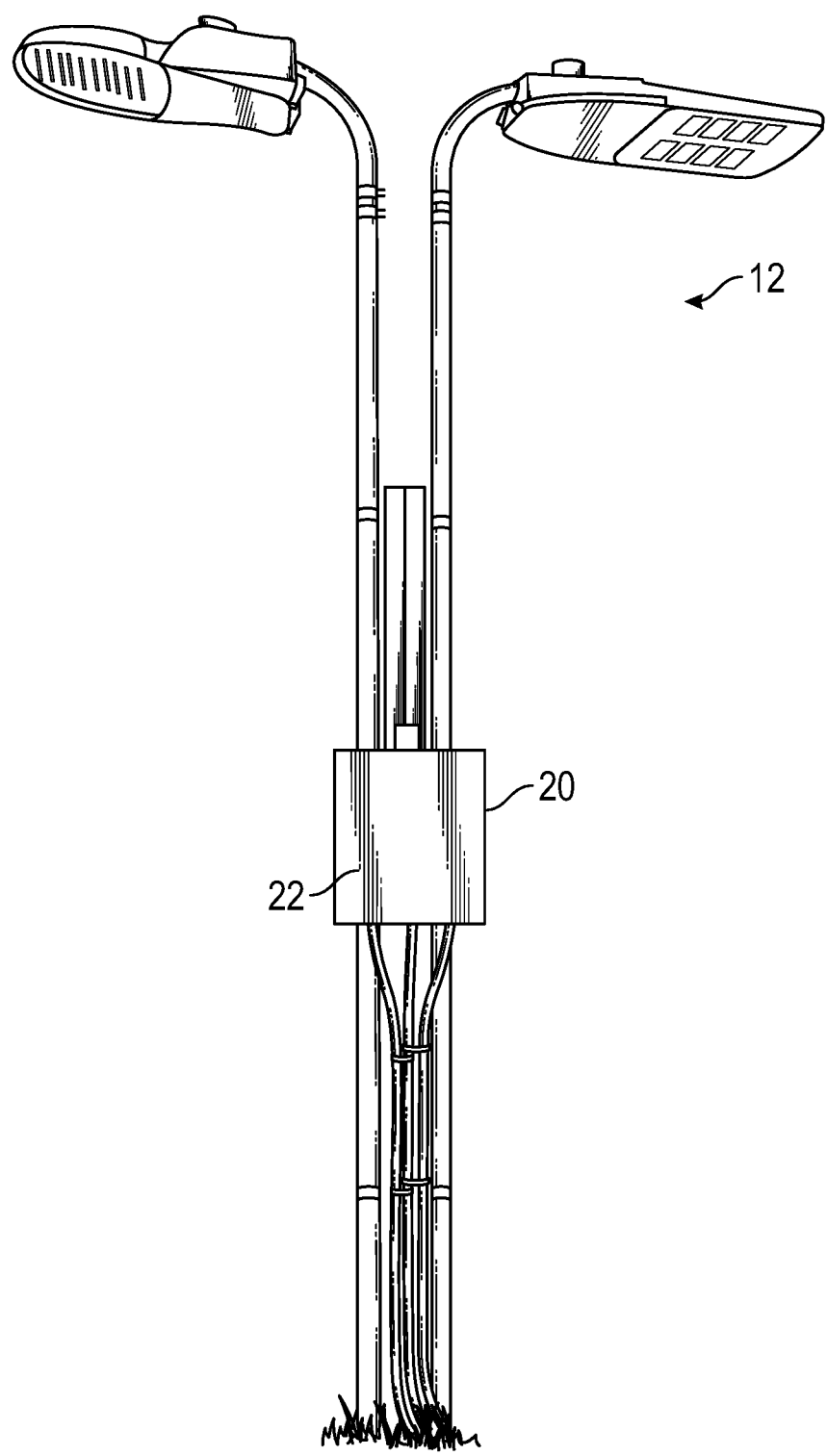
FIG. 3 depicts a light that may be controlled and/or powered in embodiments of the invention.

Light 12 is intended to represent each of the plurality of lights that may be connected to a line. The lights may be any combination of streetlights, utility lights, decorative lamps, beacon lights for illuminating a walking or driving path, lights intended to illuminate an object (such as a flag or statue), traffic indicator lights, illuminated advertisements, or any other lighting structure. An example of a light 12 that may be controlled and monitored in embodiments of the invention is shown in FIG. 3. In the example of FIG. 3, a remote light control box 20 can be seen mounted to light 12. As in the case of the pedestal 14 and control unit 16, light control box 20 houses a remote response unit 22. The remote response unit 22 may be incorporated into a single housing inside of or externally attached to control box 20, or may be spread throughout the internal components and/or structure of control box 20.

A light 12 is structurally and electrically coupled to a remote response unit 22. Remote response unit 22 may be removably or permanently attached to light 12. In some embodiments, every light in a plurality of lights attached to a power line may include a remote response unit 22, while in other embodiments, only a particular set of lights or a single light will include a remote response unit 22. As will be discussed below with respect to FIGS. 4 and 5, in embodiments where only some lights include a remote response unit 22, these lights including remote response units may be positioned as the last lights on the line in a given direction, furthest away from the control unit.

Returning to FIG. 1, current supplied to light 12 is carried by line 15, which is buried underground, usually several feet down to reduce the likelihood of accidental damage of the line. Pedestal 14 is operable to control the operation of one or more lights, such as connecting the line 15 to the power grid and regulating the supply of current. Line 15 conducts electricity from pedestal 14 to light 12, and is well-insulated to reduce the amount of current that leaks into the earth, which acts as a nearly infinite charge drain. If the line 15 is severed, cracked, or otherwise damaged, the amount of current that reaches light 12 will decrease drastically. If enough current fails to reach light 12, the light may dim, flicker, blink, or extinguish completely. Motorists, pedestrians, or other users could then be left without light, possibly causing dangerous situations in addition to frustration and dissatisfaction.

When line 15 is electrified and the light 12 is illuminated (typically, at night), an observer can easily tell whether or not the line 15 is damaged. However, during the daytime, the lines are not electrified, hiding any potential problems with line 15. As discussed above, simply electrifying the lines during the day is both expensive and dangerous, necessitating a better solution. Further, in cases where a great number of lights are under the authority of a single administration, such as the street lighting for an entire subdivision or city, checking each light visually would require an unacceptable amount of time, organization, and effort. A desirable solution would, in such cases, require automation of the line assessment process and/or simultaneous assessment of lines supplying current to a plurality of lights.

Embodiments of the invention assess damage to a line 15 by sending a test signal from a control unit 16 at pedestal 14 to a remote response unit 22 located at a test light 12. The remote response unit 22 acts as a transponder, receiving the test signal and echoing back to the control unit 16 with a response signal. The control unit 16 then receives this response signal and measures one or more of its parameters (such as its amplitude). By comparing a measured parameter to an expected value for that parameter, the control unit 16 is able to generate a determination of damage to line 15. Embodiments of the invention may further communicate measured parameters of the response signal and/or a determination of damage to the line to a remote location via a communications module 24.

For example, as seen in FIG. 1, a control unit 16 built into pedestal 14 may transmit a signal with a known amplitude and frequency on line 15. The signal is received at a remote response unit 22 attached to light 12, causing the remote response unit 22 to generate a response signal for transmission back to control unit 16. If the line 15 between control unit 16 and remote response unit 22 is damaged, a portion of the current carrying the test signal and response signal will be lost to absorption by the earth. Consequently, the measured amplitude of the response signal received at control unit 16 will be much lower than the amplitude of the previously transmitted test signal. While some amplitude loss is expected even with an undamaged line 15, a large enough loss in amplitude indicates that the line has been damaged at some point between control unit 16 and test light 12.

Figure 4:
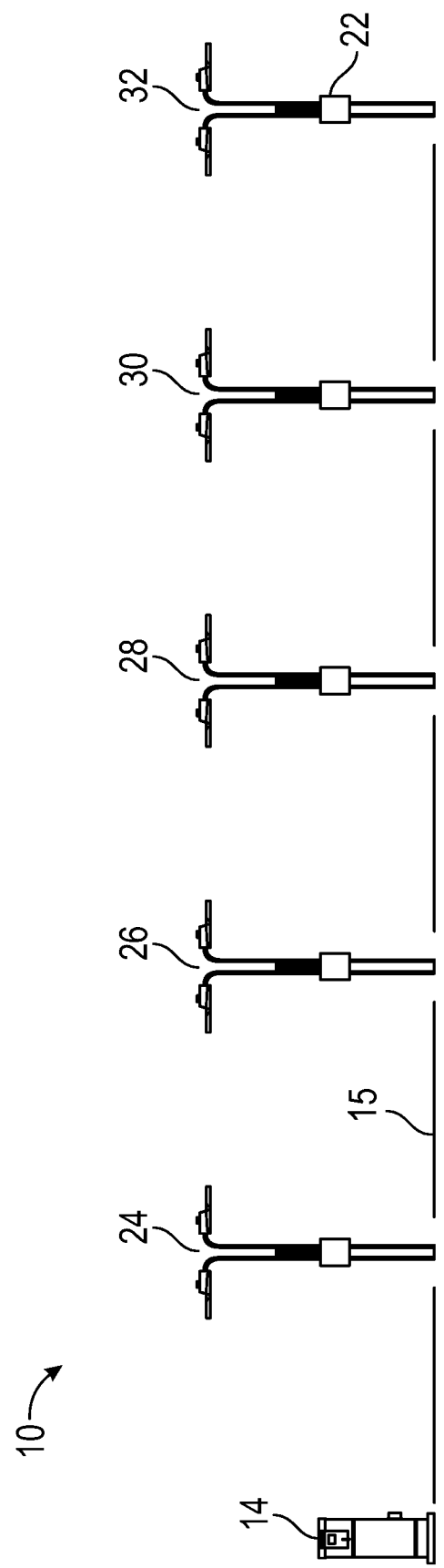
FIG. 4 is a first illustration of a pedestal control unit coupled to a plurality of lights via a line configured to carry current.
Figure 5:
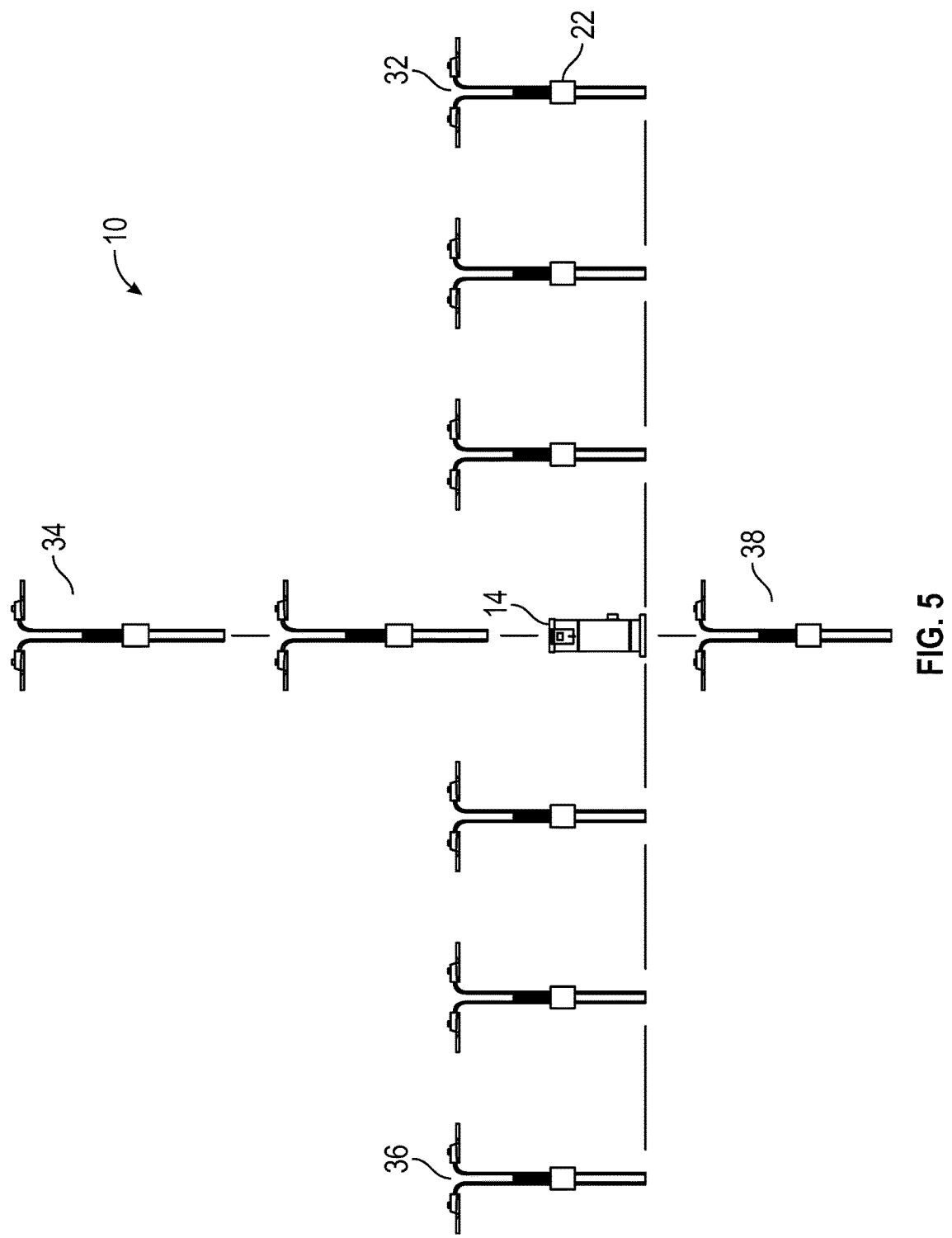
FIG. 5 is a second illustration of a pedestal control unit coupled to a plurality of lights via a line configured to carry current.
Figure 6:
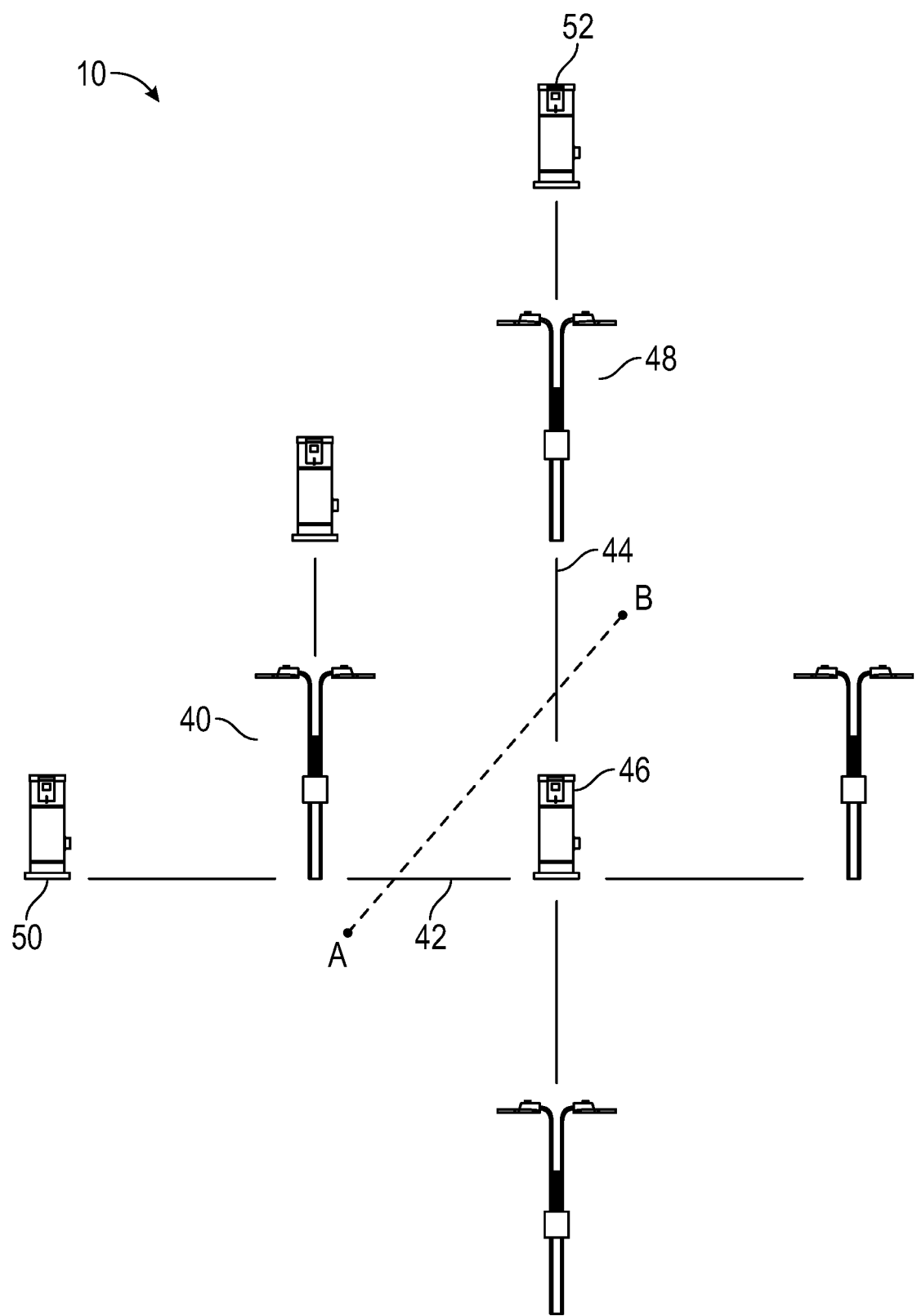
FIG. 6 is an illustration of a plurality of pedestal control units coupled to a plurality of lights via lines configured to carry current.

As seen in FIGS. 4-6, a single pedestal 14 may control and/or monitor many lights 24 in one or more directions along one or more lines 15. In FIG. 4, a single line 15 carries current from a pedestal 14 to each light 24, 26, 28, 32. A remote response unit 22 is coupled to the last light along the line, light 32, such that a response signal received from the remote response unit 22 will enable a control unit 16 at pedestal 14 to generate a determination of damage at any point along the line. If, for instance, a remote response unit was coupled to light 28 but not light 32, the control unit 16 would not be able to assess damage to line 15 at any point between light 28 and light 32. For this reason, in embodiments of the invention a remote response unit is coupled to every light 32 that is the furthest light controlled from a given pedestal 14. However, this is not intended to be limiting. In embodiments of the invention, a remote response unit 22 may be coupled to each and every light controlled from a given pedestal 14, or any subset thereof.

In FIG. 5, a pedestal 14 is connected to lines carrying current to lights in many directions. As in FIG. 4, in FIG. 5 the light 32 farthest to the right from pedestal 14 is coupled to a remote response unit 22. In addition, each of the lights 34, 36, and 38 is the farthest light controlled by pedestal 14 in their respective directions along their respective lines, and so each of lights 34, 36, and 38 is also coupled to remote response units 22. As similarly discussed in the description of FIG. 4, in embodiments of the invention, a remote response unit is coupled to every light that is the farthest light controlled from a pedestal 14 along its respective line in its given direction. However, this is not intended to be limiting. In embodiments of the invention, a remote response unit 22 may be coupled to each and every light controlled from a pedestal 14, or any subset thereof.

In practice, the range from a particular light to a pedestal operable to control the light is limited by factors such as resistance, radiative power loss, etc. For these reasons, as well as for convenience, pedestals are typically spaced no more than one mile apart. This, in turn, means that the greatest distance from a particular light to the nearest pedestal is typically no greater than one half of a mile, the range to a light located at the midpoint of two pedestals spaced one mile apart. For this reason, as seen in FIG. 6, a given light 40 may be controllable by more than one pedestal from different directions. As similarly discussed in the descriptions of FIGS. 4 and 5, in embodiments of the invention, a remote response unit is coupled to every light that is the farthest light controlled from a given pedestal along its respective line in its given direction. However, this is not intended to be limiting. In embodiments of the invention, a remote response unit 22 may be coupled to each and every light controlled from a given pedestal 14, or any subset thereof.

As briefly discussed above, a common situation where damage to underground current-carrying lines can occur is during the installation of new buried cables, such as fiber-optic cable. For example, to install a new buried cable between points A and B on FIG. 6, a serviceman would dig holes at each of these points, then drill a small tunnel between the holes. Doing so creates the possibility that lines 42 and/or 44 may have been damaged at their respective points of intersection with the tunnel. Employing embodiments of the invention, the serviceman may operate a control unit coupled to pedestal 46 to send a test signal to remote response units coupled to lights 40 and 48 along lines 42 and 46, generating an assessment of damage to the lines based on measured parameters of the respective response signals. The method may be initiated by the serviceman using user controls built into the control unit coupled to pedestal 46, or may be initiated from a remote location by a signal received through a communications module 24 in the control unit.

Alternatively, damage to the lines may be assessed by transmission of a test signal from pedestal 46 to remote response units coupled to pedestals 50 and 52. Response signals transmitted from remote response units at these pedestals would enable the control unit at pedestal 46 to assess damage at any point along the intervening lines 42 and 44. In embodiments of the invention, remote response units may be coupled to pedestals, coupled to other components electrically coupled to a line 15, or may be coupled directly to the line. Of course, the locations of the control unit and remote response unit could be reversed in the preceding example, meaning a single remote response unit at pedestal 46 could send response signals to test signals transmitted from pedestals 50 and 52 in embodiments of the invention. This, however, would require initiation of the tests from both pedestals 50 and 52, either manually or remotely.

Figure 7:
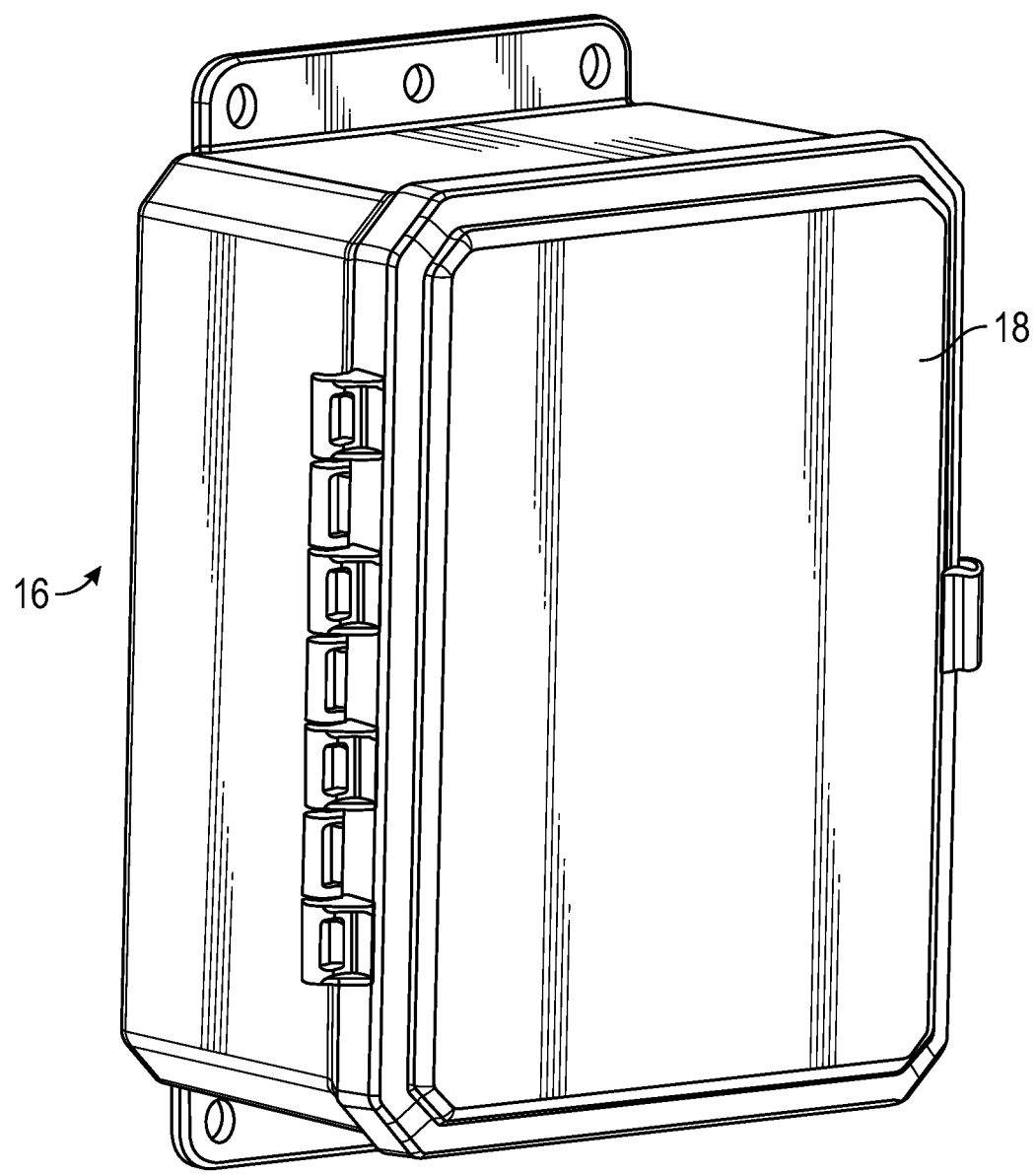
FIG. 7 is a perspective view of a unit configured to control a light in embodiments of the invention.

A perspective view of one embodiment of a housing 18 containing control unit 16 is illustrated in FIG. 7. This structure is not intended to be limiting—control unit 16 may be contained in any shape or style of housing, or may not be incorporated into a single housing at all. Housing 18 may be formed as a handheld device, which a serviceman may electrically couple and decouple to locally assess damage to power lines. Components listed below that function as control unit 16 may be spread throughout the internal components of a pedestal.

Figure 8:
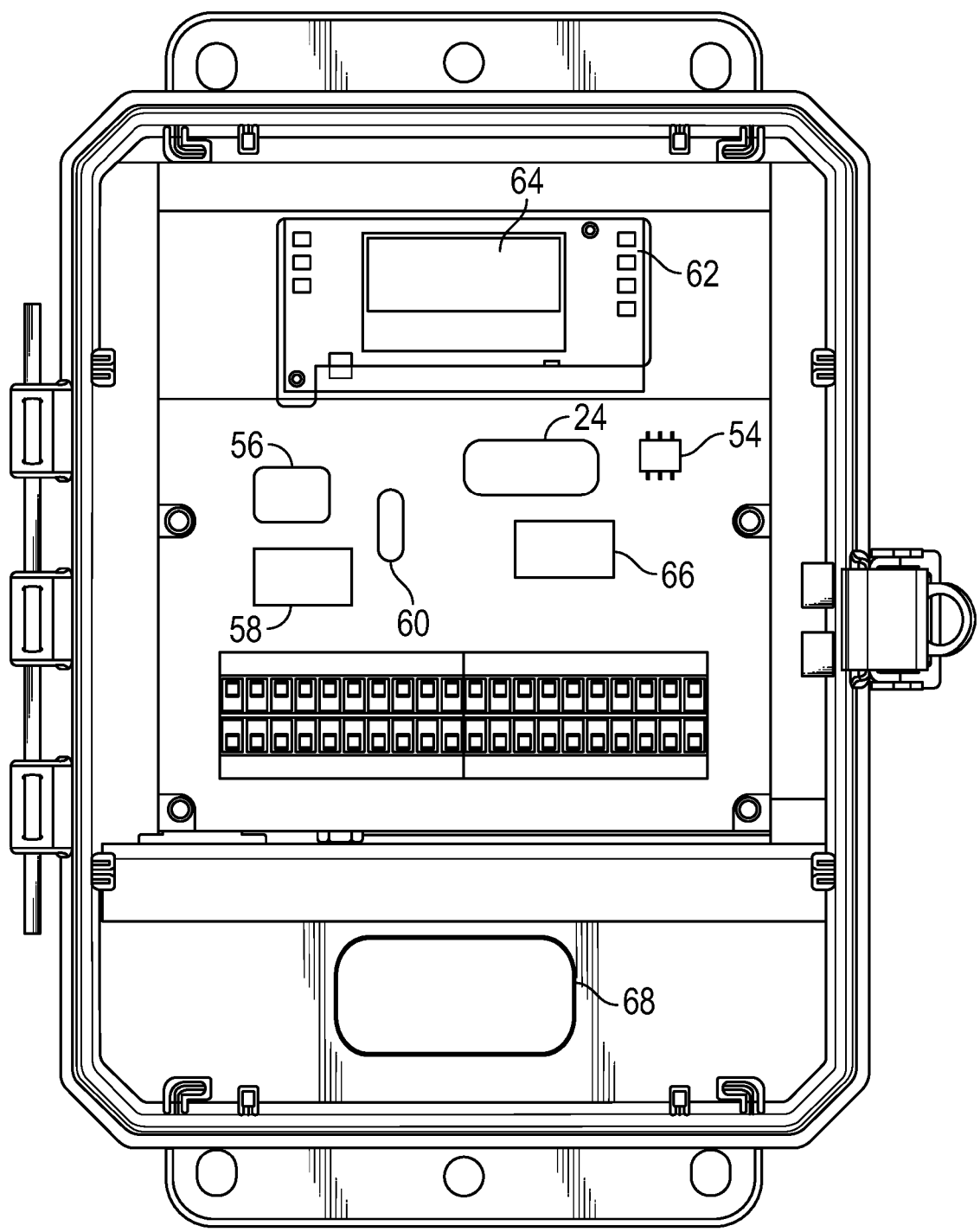
FIG. 8 is a first diagram of elements comprising embodiments of the invention.

Turning to FIG. 8, a block diagram illustrating elements included in a control unit 16 of embodiments of the invention includes a processor 54, transmitter 56, receiver 58, signal generator 60, communications module 24, and user controls 62. Control unit 16 may further include a visual display 64 for displaying current operation, statuses, measured parameters, and/or generated alerts of assessed damage. The visual display 64 may be a touch screen display, combining the functions of data display and user controls 62. Control unit 16 may include a non-volatile memory unit 66, configured to store instructions for operation of the invention, measured parameters of one or more response signals, and/or determinations of damage to one or more lines. All the elements of control unit 16 may be wholly or partially contained within the housing 18, though the locations of each as illustrated in FIG. 8 are meant only for example. In embodiments of the invention, any particular element listed may be shaped or positioned differently, or may be absent altogether.

Processor 54 may be implemented as any suitable type and/or number of processors, such as a host processor of control unit 16, for example. To provide additional examples, processor 54 may be implemented as an application specific integrated circuit (ASIC), an embedded processor, a central processing unit (CPU) associated with control unit 16, a graphical processing unit (GPU), etc.

Processor 54 may be configured to communicate with one or more of transmitter 56, receiver 58, signal generator 60, communications module 24, visual display 64, non-volatile memory unit 66, and user controls 62 via one or more wired and/or wireless interconnections, such as any suitable number of data and/or address buses, for example. These interconnections are not shown in FIG. 1 for purposes of brevity.

Processor 54 may be configured to operate in conjunction with one or more of communications module 24, user controls 62, visual display 64, receiver 58, signal generator 60, and non-volatile memory unit 66 to process and/or analyze data, to store data to non-volatile memory unit 66, to retrieve data from non-volatile memory unit 66, to display information on visual display 64, to receive, process, and/or interpret data metrics from receiver 58, to process user interactions via user controls 62, to receive data from and/or send data to one or more remote locations via communications module 24, etc.

In embodiments where the system is locally manually controlled, user controls 62 may be operated to initiate a determination of damage to the line. Additionally or alternatively, in some embodiments, communications module 24 may be operable to receive control data such as initiation of an assessment or modification of settings from a remote location. Settings that may be modified may, for instance, include intervals for assessment, expected values, and alert generation instructions, as further discussed below. In some embodiments, control unit 16 may include a power source 68, such as a battery, to power the signal generator 60, processor 54, display, etc. In other embodiments, the control unit 16 draws power directly from pedestal 14, negating the need for a power source 68.

Signal generator 60 is operable to generate a test signal at a selected frequency and transmit it on a line via transmitter 56. To prevent the test signal from being utilized to power lights on the line, in embodiments of the invention, the test signal is transmitted at a frequency that is outside of a range of usable frequencies for the lights coupled to the line. The subsequent response signal may similarly be transmitted at a frequency that is outside of a range of usable frequencies for the lights coupled to the line. For example, almost all lights used for streetlights, environmental lighting, etc. operate on AC current supplied at 50-60 Hertz. Signals transmitted on the line at frequencies that are significantly above or below this range will not be usable by the lights, and thus the majority of loss measured in the response signal may be attributed to damage to the line. In some embodiments, either or both of the test signal and response signal is generated and transmitted at frequencies that are at least 10 times, at least 25 times, at least 50 times, or at least 100 times as great as the highest usable frequency of any light on the line 15. In some embodiments, the test signal and response signal are generated and transmitted at the same frequency, while in other embodiments the test signal and response signal are selected to be generated and transmitted at different frequencies, as further discussed below.

Figure 9:
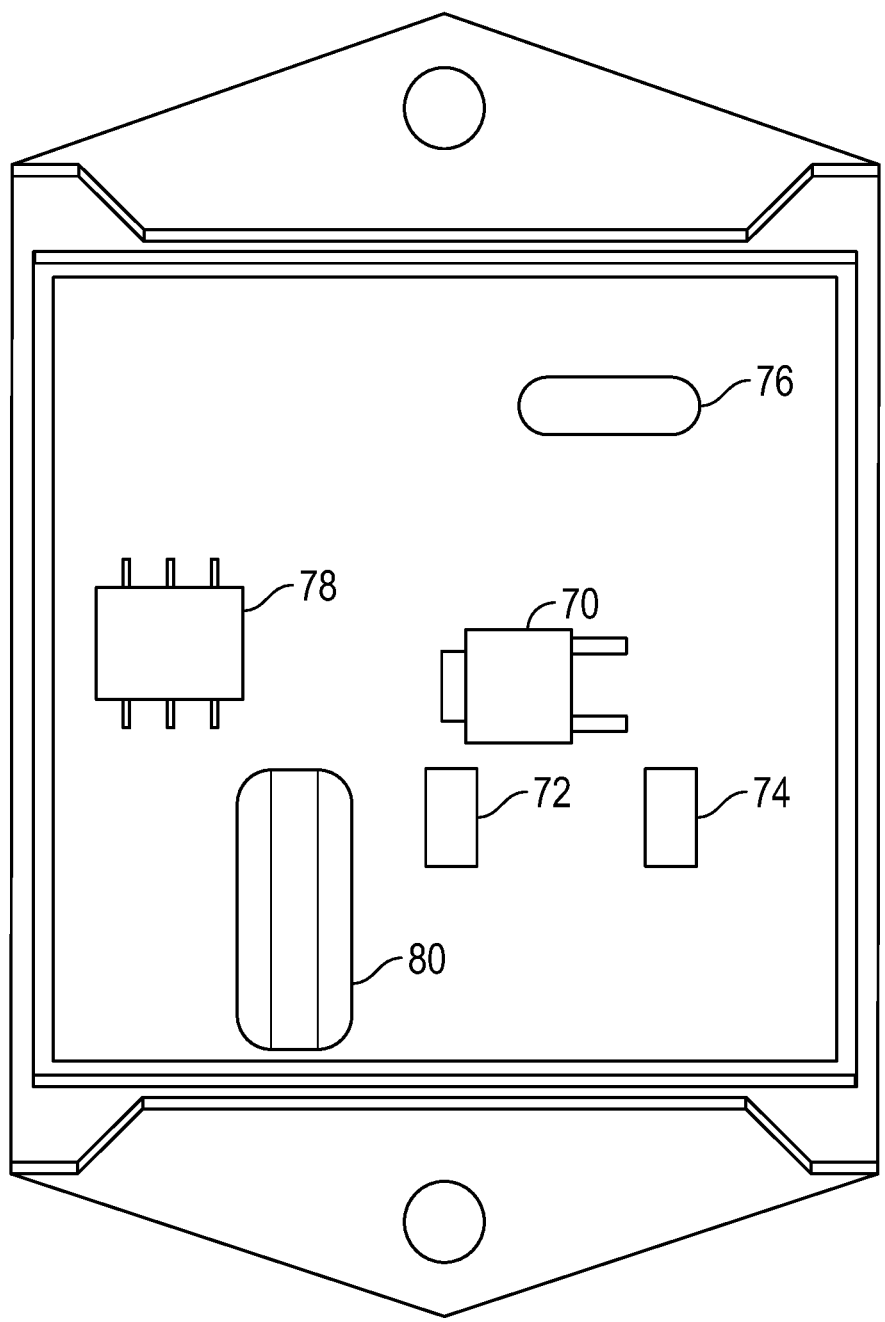
FIG. 9 is a second diagram of elements comprising embodiments of the invention.

Turning to FIG. 9, a block diagram illustrating elements included in a remote response unit 22 of embodiments of the invention includes an energy storage device 70, transmitter 72, receiver 74, and signal generator 76. In some embodiments, remote response unit may further include a processor 78 and/or communications module 80. In embodiments of the invention, the energy storage device may be, for example, a battery, inductor, or capacitor. All the elements of control unit 16 may be wholly or partially contained within the housing 18, though the locations of each as illustrated in FIG. 9 are meant only for example. In embodiments of the invention, any particular element listed may be shaped or positioned differently, or may be absent altogether.

Communications modules 24 and 80 may be identical or may operate in completely unrelated ways. Structures supporting any method or protocol of communication are intended for possible embodiments of communications modules 24 and 80. For example, either or both of communications modules 24 and 80 may be embodied as a cellular modem, wired telephone modem, satellite transmitter/receiver, or radio frequency transmitter. These examples are not intended to be limiting.

A test signal from transmitter 56 at control unit 16 is received at receiver 74 in remote response unit 22. In some embodiments of the invention, the current of the test signal is used to charge energy storage device 70, bypassing a need for a power source incorporated into remote response unit 22. In other embodiments, the energy storage device may provide power to the device independent of the test signal, or the remote response unit may draw power from another external source. As energy storage device 70 is part of response unit 22, it is either directly or indirectly coupled to the line 15. In embodiments of the invention, the energy storage device 70 charges from the test signal until it surpasses a threshold level of charge, at which point signal generator 76 generates a response signal at a selected frequency. This threshold level of charge may be due to hardware configurations, and/or may be set at installation or manufacture of the remote response unit 22, and/or may be modified by a user. In embodiments wherein remote response unit 22 includes a processor 78, the selected frequency for response signals and/or the threshold level of charge for response signal generation may be stored in a second non-volatile memory unit, not illustrated.

Back at the control unit 16, the response signal will be received by receiver 58, at which point values of parameters such as the response signal's amplitude may be measured by the processor 54 to generate a determination of damage to the line, as discussed above. The value of the measured amplitude of a response signal may be compared to an expected amplitude stored in non-volatile memory unit 66 to assess the condition of the line, generating a determination of damage. The determination of damage may then be transmitted to a remote location via communications module 24. In some embodiments, this expected amplitude might be adjusted up or down using user controls 62, based on messages received from a remote location via communications module 24, or calculated and adjusted automatically by processor 54. Additionally or alternatively, the values of any measured parameters themselves may be transmitted via communications module 24 to a remote location. A determination of damage to the line based on the measured amplitude of the response signal may additionally or alternatively be performed at the remote location.

When a control unit 16 generates and transmits a response signal via transmitter 72, the level of total charge contained within energy storage device 70 will drop back below the threshold level of charge. So long as the test signal continues to be received by receiver 74, the charge of the energy storage device 70 will continue to climb, until once again it surpasses the threshold level of charge, causing a retransmission of the response signal. In embodiments of the invention, the processor 54 may additionally or alternatively measure the period between consecutive receptions of the response signal by receiver 58. The processor 54 may generate a determination of damage to the line based on this response period, transmit the determination of damage to a remote location via communications module 24, and/or store the response period in non-volatile memory unit 66. This determination of damage to the line may be performed by comparing the response period to an expected period for response stored in non-volatile memory unit 66. In some embodiments, this expected period for response might be adjusted from user controls 62, received from a remote location via communications module 24, or calculated automatically by processor 54.

As with the measured amplitude of the response signal, the measured response period may additionally or alternatively be itself transmitted via communications module 24 to a remote location. A determination of damage to the line based on the measured response period may additionally or alternatively be performed at the remote location.

In cases where a line 15 has been badly damaged, the response signal may not be received by receiver 58 whatsoever. In embodiments of the invention, processor 54 may be configured to determine the line 15 to be damaged if the response signal is not received. Again, this determination may be transmitted to a remote location via communications module 24 and/or stored in non-volatile memory unit 66. In some embodiments, an allotted response period may be stored in non-volatile memory unit 66. For example, allotted response period may require that the response signal should be received within 5 seconds or a pre-set response period, as measured from the moment the test signal is transmitted via transmitter 56. If no response signal is received by receiver 58 within this allotted response period, processor 54 may be configured to determine the line 15 to be damaged. In some embodiments, this allotted response period may be adjusted from user controls 62, received from a remote location via communications module 24, or calculated automatically by processor 54.

The embodiments discussed above for generating a determination of damage to the line based on a measured amplitude, measured period for response, and allotted response time are not intended to be limiting or mutually exclusive. Any parameter of the response signal may be compared to an expected value for that parameter to generate a determination or damage to the line 15. Further, in some embodiments, determination of damage to the line may be performed based on more than one comparison of the value a measured parameter of the response signal to an expected value. In some embodiments, an alert may be generated by processor 54 and/or at the remote location if both the comparison of the first parameter to the first expected value and the comparison of the second parameter to the second expected value indicate damage to the line. Alternatively, in some embodiments, an alert may be generated by processor 54 and/or at the remote location if either the comparison of the first parameter to the first expected value or the comparison of the second parameter to the second expected value indicate damage to the line. Regardless, an alert may be generated by processor 54 and/or at the remote location if at least one of a first determination of damage to the line and a second determination of damage to the line indicates damage to the line.

Alerts generated to indicate a determination of damage to the line may be presented in any form at either or both of the control unit 16 and a remote location. Alerts may be audible, visual, textual, haptic, or have any other attention-grabbing properties to alert an appropriate user that the line has been determined to be damaged. An alert may alternatively or additionally include a message, such as a MMS text or email, transmitted from communications module 24 in control unit 16. A set of recipients for such an alert message may be stored in non-volatile memory unit 66. An alert may be presented via a website or dedicated administration software, and may be relayed by a remote communications module at the remote location. Alerts presented at the control unit 16 may include an indication on a visual display and/or may be indicated by warning lights, speakers, vibration, etc. Any type of alert of damage and any combination of alerts are intended for inclusion within embodiments of the invention.

In some embodiments, a critical damage alert may be produced by processor 54 and/or at the remote location if a response signal was not received within an allotted response period. A critical damage alert may be presented in a different manner than alerts due to a comparison of amplitudes or periods for response. A critical damage alert may be a different color, different sound, louder, and/or may transmit a message to a larger and/or different set of recipients. Any or all of the above alert actions may be stored in non-volatile memory unit 66.

As mentioned above, in some embodiments the response signal may be generated and transmitted at a different frequency from test signal. Doing so allows the control unit 16 to isolate the response signal from the test signal even while the two are simultaneously transmitted on the line. In some embodiments, the response signal may be isolated by incorporation of a filter to control unit 16, such as a high-pass, low-pass, or band-pass filter. While the frequency of the test signal may be chosen to be much higher than the highest usable frequency of a light on the line, as previously discussed, the response frequency may be chosen to be even higher. In such a case, a high-pass filter with a cutoff frequency between the frequency of the test signal and the frequency of the response signal would allow only the test signal to pass from receiver 58 to processor 54. Similarly, if the response frequency was chosen to be lower than the test frequency, a low-pass filter with a cutoff frequency between the frequency of the test signal and the frequency of the response signal would allow only the test signal to pass from receiver 58 to processor 54. These examples are not meant to be limiting. In particular embodiments of the invention, any frequencies may be chosen, and in those embodiments where the frequency of the test signal is chosen to be different from (i.e., is not equal to) that of the response signal, the response signal may be isolated by any method. In embodiments where the frequency of the test signal is equal to the frequency of the response signal, time-domain reflectometry may be performed by processor 54 to isolate the response signal.

In embodiments of the invention, the step of isolating the response signal from the test signal is performed based on the frequency of the response signal. For example, in one embodiment the frequency of the test signal may be 16 kHz, while the response signal is generated at a frequency of 20 kHz. Hardware or software at the control unit 18 may then be operable to isolate the response signal by selectively permitting its 20 kHz frequency. These values are merely exemplary, and are not intended to be limiting. In some embodiments, the response frequency may be lower than the test frequency. So long as the frequencies differ, the response signal can be isolated based on its frequency without requiring complicated time-domain separation.

While reference has been made above to the various components and techniques of embodiments of the invention, the description that follows will provide further examples systems and processes that may be added in embodiments of the invention. The description below is intended to merely exemplify steps that may be taken in practice of operation of embodiments of the invention and is not intended to be limiting. Steps that may be performed in practice of some embodiments of the invention are illustrated in FIG. 10 and herein described.

Figure 10:
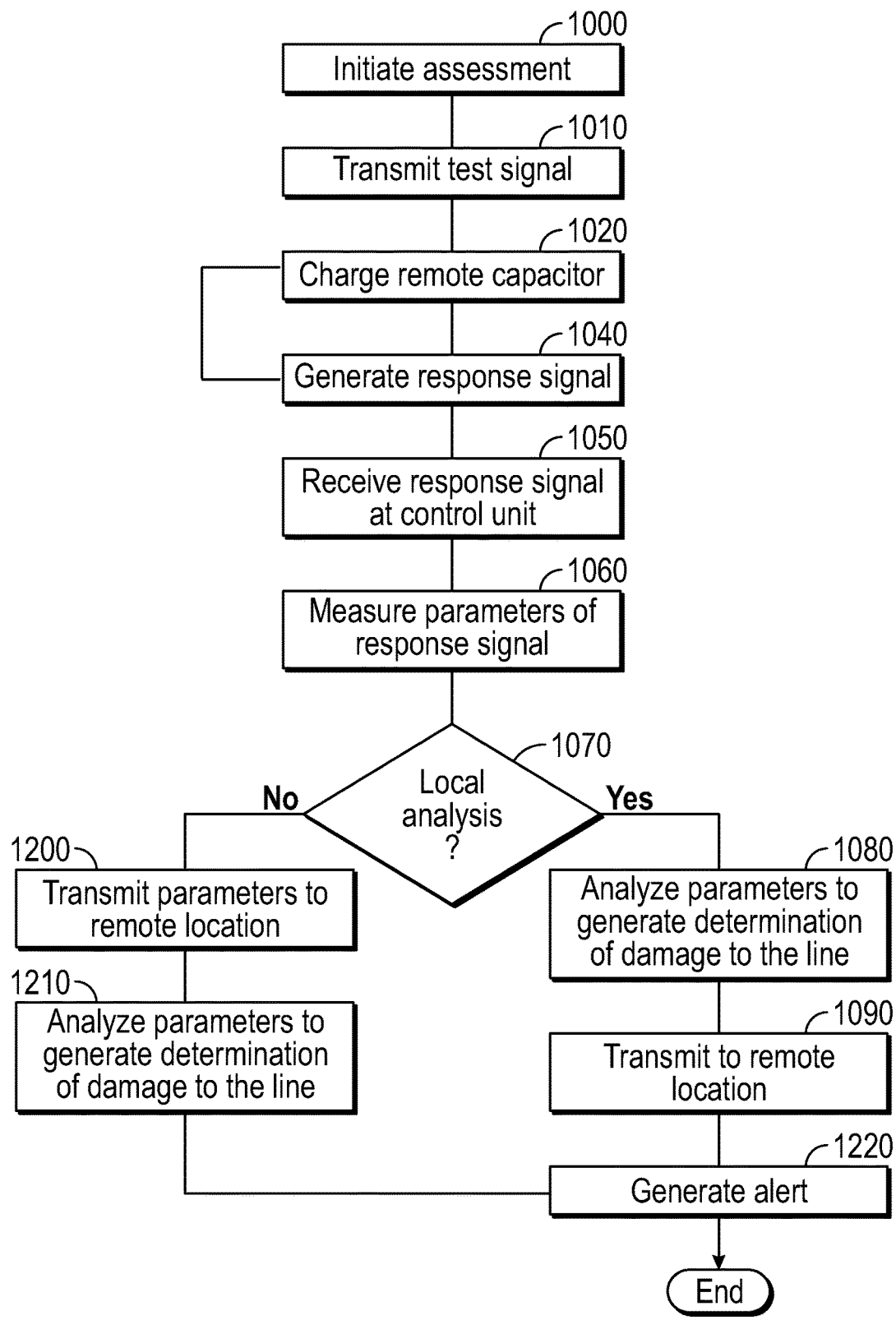
FIG. 10 is a flow diagram of steps that may be performed in embodiments of the invention.

FIG. 10 illustrates the basic steps performed in operation of an embodiment of the invention. These steps may be performed in any order, and some steps may be performed simultaneously.

First, in step 1000, an assessment is initiated at a control unit 16. The initiation may be in response to input from user controls 62, a message received from a remote location via communications module 24, and/or initiated automatically in response to the expiration of a timer. For example, an assessment may be performed in response to a serviceman's depression of a button, a request from a central monitoring station, and/or daily from an internal, pre-scheduled initiation time. In some embodiments of the invention, a regular schedule for initiation of assessments may be stored in non-volatile memory unit 66. The schedule may be modified via user controls 62 and/or from a remote location via communications module 24.

Regardless of its source, in response to the initiation, the processor 54 commands the first signal generator 60 to generate a test signal at a test frequency in step 1010 and transmit it via transmitter 56 on a line 15. The value of the test frequency may be stored in non-volatile memory unit 66, and it may be chosen to be outside a range of usable frequencies for lights attached to line 15. In particular, the test frequency may be at least 5 times, 10 times, 25 times, 50 times, 75 times, or 100 times as great as a highest usable frequency for any light on line 15. The test signal may be a continuous signal, or may be transmitted as one or more periodic bursts or "pings." The test signal then propagates down line 15 until it reaches a remote response unit 22 coupled to a light 12, pedestal 50, or directly to line 15 and is received by receiver 74. At step 1020, current carried by the test signal is used to charge the energy storage device 70 in remote response unit 22.

When the charge of energy storage device 70 surpasses a set threshold level of charge, a response signal is generated by signal generator 76. The threshold level of charge may be adjusted by a manual or remote user input, and/or may be set at manufacture of the remote response unit 22. The response signal is generated by signal generator 76 at the response frequency and transmitted on the line 15 back to control unit 16 by transmitter 72. Like the test frequency (that of the test signal), the response frequency of the response signal may be chosen to be outside a range of usable frequencies for lights attached to line 15. In particular, the response frequency may be at least 5 times, 10 times, 25 times, 50 times, 75 times, or 100 times as great as a highest usable frequency for any light on line 15. Generation and transmission of the response signal at step 1040 causes the charge held by energy storage device 70 to drop back below the threshold level of charge. If the energy storage device continues to receive the test signal, the energy storage device's charge will once again rise to the level of the threshold level of charge, causing the loop seen on FIG. 10 between steps 1020 and 1040. The result of this loop will be periodic transmissions of the response signal on the line 15, with a period set by the level of current received from reception of the test signal. As the current received by the test signal will show dependence on damage incurred by the line 15, so too will the response period. Specifically, if the line 15 is damaged, the period between successive transmissions of the response signal will be lengthened.

At step 1050, the response signal is received by receiver 58 back at control unit 16. As the period between successive transmissions of the response signal by transmitter 72 will be lengthened by damage to the line 15, so too will successive receptions of the response signal by receiver 58. At step 1060 this parameter may be measured by the processor 54 of control unit 16. Additionally or alternatively, the amplitude of the response signal may be measured by the processor 54 at step 1060.

At step 1070, a determination is made as to whether the analysis of the parameters is done locally by processor 54 or at a remote location. The remote location includes its own communications module for receiving signals from the control unit 16 and a processor for at least performing an analysis of the measured parameters.

If the analysis of the parameters is to be performed by processor 54 in control unit 16, the process continues to step 1080. The measured parameters, such as the energy of the response signal or the period for response, are compared to expected values for these parameters stored in non-volatile memory unit 66, generating a determination of damage to the line 15. For example, in an embodiment of the invention, if the measured amplitude of the response signal is less than 50% of the amplitude of the test signal, the line 15 may be determined to be damaged at some point between control unit 16 and remote response unit 22. Further, if the measured amplitude of the response signal is less than 10% of the amplitude of the test signal, the line 15 may be determined to be critically damaged at some point between control unit 16 and remote response unit 22. These values are intended only for example, and are not meant to be limiting. Any set amount of the amplitude of the test signal or an absolute set amplitude may be used to generate a determination of damage to the line in embodiments of the invention.

At step 1090, the outcome of the determination of damage to the line is transmitted to a remote location via communications module 24. In some embodiments this step may be performed after each assessment, while in other embodiments this step is only performed if the determination indicates that the line 15 is damaged. In some embodiments, a determination of damage to the line may be transmitted to a remote location at pre-set times. For instance, the determination may be sent every 3 hours from sunrise to sunset to ensure that the lights will be operational when needed. Any regular interval may be employed in embodiments of the invention.

Alternatively, the analysis of the parameters may be performed at a remote location. In this case, the process continues from step 1070 to step 1200. The measured parameters such as the amplitude of the response signal or response period are transmitted to one or more remote locations via communications module 24. In step 1210, one or more processors at the remote location(s) then compares the measured parameters to expected values, generating a determination of damage to the line 15.

In some embodiments, both the methods of steps 1080-1090 and steps 1200-1210 may be performed. That is, analysis of measured parameters of the response signal may be performed both at the control unit 16 and at the remote location. In such cases, communications module 24 must transmit both the alert generated by processor 54 and the values of the measured parameters to the remote location.

In step 1220, an alert is generated based on the comparison of the measured parameter to its expected value regardless of where the comparison is performed. The alert may be generated locally by processor 54 and/or at the remote location. The alert may be visible and/or audible, and may be transmitted to another location or set of locations to inform the appropriate users of the results. In some embodiments, an alert may be generated only if the comparison indicates that the line 15 is damaged. In other embodiments, the system generates an alert for any result of the comparison, with some alerts indicating damage to the line and others indicating non-damage.

In some embodiments, an additional assessment may be initiated based on the results of a previous assessment. For example, if the amplitude of the response signal is between 50% and 70% of the amplitude of the test signal, a second assessment may be initiated by processor 54 to verify a likely damaged line 15. This example is not meant to be limiting—any measured parameter, expected value, or comparison location could trigger an additional assessment in embodiments of the invention.

It should be appreciated that, while the above disclosure is directed mainly to the field of municipal utilities, some embodiments of the invention may be employed for any field requiring safe, convenient assessment of damage to underground, overhead, or internal power lines. Embodiments of the invention may be used in any setting or field, such as construction, military, manufacturing, or marine uses. Embodiments of the invention may be particularly applied to preventing and/or identifying theft of copper wire from buildings, utilities, work sites, etc. The lighting utility maintenance field discussed is merely exemplary and should not be construed as limiting.

Having thus described various embodiments of the invention, what is claimed as new and desired to be protected by Letters Patent includes the following:

1. A method of assessing a condition of a line configured to supply electric current to a light, the method comprising the steps of:
    transmitting, on the line, a test signal at a test frequency, wherein current supplied by the test signal charges an energy storage device electrically coupled to the line;
    transmitting, on the line, a response signal at a response frequency when a charge of the energy storage device reaches a threshold level of charge,
    wherein transmitting the response signal reduces the charge of the energy storage device below the threshold level of charge,
    wherein the response signal is retransmitted each time the charge of the energy storage device reaches the threshold level of charge;
    measuring a period between consecutive receptions of the response signal; and
    generating a determination of damage to the line by comparing the period between consecutive receptions of the response signal to an expected period.

2. The method of claim 1, wherein the response frequency is equal to the test frequency.

3. The method of claim 1, wherein the test frequency and the response frequency are outside a range of usable frequencies for the light.

4. The method of claim 3, wherein the test frequency and the response frequency are at least 10 times greater than a highest usable frequency of the light.

5. The method of claim 1, wherein the energy storage device is selected from the group consisting of a battery, an inductor, and a capacitor.

6. The method of claim 1, wherein the determination of damage to the line is a first determination of damage to the line, and further comprising the steps of:
    measuring a value of a second parameter of the response signal;
    generating a second determination of damage to the line in response to an analysis of the value of the second parameter; and
    generating an alert if at least one of the first determination of damage to the line and the second determination of damage to the line indicates damage to the line.

7. The method of claim 1,
    further comprising the step of transmitting the period between consecutive receptions to a remote location,
    wherein the step of generating a determination of damage to the line is performed at the remote location.

8. A system to assess a condition of a line configured to supply electric current to a plurality of lights, the system comprising:
    a control unit comprising a processor; and
    a remote response unit comprising an energy storage device,
    wherein the remote response unit is coupled to a light along the line furthest from the control unit in a given direction,
    wherein the remote response unit is configured to perform the steps of:
    receiving, from the line, a test signal transmitted by the control unit at a test frequency,
    charging an energy storage device using current supplied by the test signal, and
    transmitting, on the line, a response signal at a response frequency when the energy storage device reaches a threshold level of charge,
    wherein the processor is configured to generate a determination of damage to the line in response to an analysis of the response signal.

9. The system of claim 8, wherein the response frequency is equal to the test frequency.

10. The system of claim 8,
    wherein the control unit further comprises a first transmitter, a first receiver, and a first signal generator, and
    wherein the remote response unit further comprises a second transmitter, a second receiver, and a second signal generator.

11. The system of claim 8, wherein the control unit further comprises a communications module operable to receive control data from a remote location.

12. The system of claim 8, wherein the control unit further comprises a communications module operable to transmit the determination of damage to the line to a remote location if the determination indicates that the line is damaged.

13. The system of claim 8, wherein the control unit further comprises a communications module operable to transmit the determination of damage to the line to a remote location at regular intervals of time.

14. A method of assessing a condition of a line configured to supply electric current to a light, the method comprising the steps of:
    transmitting, on the line, a test signal at a test frequency, wherein current supplied by the test signal charges an energy storage device electrically coupled to the line;
    transmitting, on the line, a response signal at a response frequency when a charge of the energy storage device reaches a threshold level of charge,
    wherein the response frequency is not equal to the test frequency;

isolating the response signal from the test signal based on the response frequency;

measuring a value of a first parameter of the response signal; and generating a determination of damage to the line in response to an analysis of the value of the first parameter.

15. The method of claim 14, wherein the test frequency and the response frequency are outside a range of usable frequencies for the light.

16. The method of claim 15, wherein the test frequency and the response frequency are at least 10 times greater than a highest usable frequency of the light.

17. The method of claim 14, wherein the energy storage device is selected from the group consisting of a battery, an inductor, and a capacitor.

18. The method of claim 14, wherein the first parameter of the response signal is a response amplitude, wherein the step of generating the determination of damage to the line is achieved by comparing the response amplitude to an expected amplitude.

19. The method of claim 14, wherein the determination of damage to the line is a first determination of damage to the line, and further comprising the steps of:

measuring a value of a second parameter of the response signal;

generating a second determination of damage to the line in response to an analysis of the value of the second parameter; and generating an alert if at least one of the first determination of damage to the line and the second determination of damage to the line indicates damage to the line.

20. The method of claim 14, further comprising the step of transmitting the value of the first parameter to a remote location, wherein the step of generating a determination of damage to the line is performed at the remote location.

21. A method of assessing a condition of a line configured to supply electric current to a light, the method comprising the steps of:

transmitting, on the line, a test signal at a test frequency, wherein current supplied by the test signal charges an energy storage device electrically coupled to the line;

transmitting, on the line, a response signal at a response frequency when a charge of the energy storage device reaches a threshold level of charge; and generating a determination of damage to the line if the response signal is not received.

22. The method of claim 21, wherein the test frequency and the response frequency are outside a range of usable frequencies for the light.

23. The method of claim 22, wherein the test frequency and the response frequency are at least 10 times greater than a highest usable frequency of the light.

24. The method of claim 21, wherein the energy storage device is selected from the group consisting of a battery, an inductor, and a capacitor.

* * * * *